United States Patent
Gourdel et al.

(10) Patent No.: US 9,679,799 B2
(45) Date of Patent: Jun. 13, 2017

(54) PROCESS FOR FABRICATING A SEMICONDUCTOR-ON-INSULATOR SUBSTRATE

(71) Applicant: Soitec, Crolles (FR)

(72) Inventors: Christophe Gourdel, Saint Maximin (FR); Oleg Kononchuk, Grenoble (FR)

(73) Assignee: SOITEC, Bernin (FR)

( * ) Notice: Subject to any disclaimer, the term of this patent is extended or adjusted under 35 U.S.C. 154(b) by 0 days.

(21) Appl. No.: 14/441,473

(22) PCT Filed: Sep. 25, 2013

(86) PCT No.: PCT/IB2013/002146
§ 371 (c)(1),
(2) Date: May 7, 2015

(87) PCT Pub. No.: WO2014/080256
PCT Pub. Date: May 30, 2014

(65) Prior Publication Data
US 2015/0311110 A1    Oct. 29, 2015

(30) Foreign Application Priority Data
Nov. 20, 2012 (FR) .................................... 12 03106

(51) Int. Cl.
*H01L 21/762* (2006.01)
*H01L 21/84* (2006.01)
*H01L 21/324* (2006.01)

(52) U.S. Cl.
CPC ........ *H01L 21/7624* (2013.01); *H01L 21/324* (2013.01); *H01L 21/76251* (2013.01); *H01L 21/84* (2013.01)

(58) Field of Classification Search
CPC .... H01L 21/7624; H01L 21/324; H01L 21/84
See application file for complete search history.

(56) References Cited

U.S. PATENT DOCUMENTS

| | | |
|---|---|---|
| 2005/0118789 A1 | 6/2005 | Aga et al. |
| 2006/0051945 A1* | 3/2006 | Yokokawa ........ H01L 21/76243 438/526 |
| 2010/0193899 A1* | 8/2010 | Kononchuk ........ H01L 21/7624 257/506 |

(Continued)

OTHER PUBLICATIONS

International Search Report for International Application No. PCT/IB2013/002146 mailed Jan. 1, 2014, 3 pages.

(Continued)

*Primary Examiner* — Mamadou Diallo
(74) *Attorney, Agent, or Firm* — TraskBritt (57) ABSTRACT

The present disclosure relates to a process for fabricating a plurality of semiconductor-on-insulator structures, the insulator being a layer of silicon dioxide having a thickness smaller than 50 nm, each structure comprising a semiconductor layer placed on the silicon dioxide layer, the fabrication process comprising a step of heat treating the plurality of structures, which heat treatment step is designed to partially dissolve the silicon dioxide layer, the heat treatment step being carried out in a non-oxidizing atmosphere and the pressure of the non-oxidizing atmosphere being lower than 0.1 bar.

20 Claims, 4 Drawing Sheets

(56) References Cited

U.S. PATENT DOCUMENTS

2010/0283118 A1    11/2010  Kononchuk et al.
2011/0223740 A1*  9/2011  Ishizuka ........... H01L 21/76254
                                                            438/458

OTHER PUBLICATIONS

Kononchuk et al., Internal Dissolution of Buried Oxide in SOI Wafers, Sold State Phenomeda, vols. 131-133, (2008), pp. 113-118.
Kononchuk et al., Novel Trends in SOI Technology for CMOS Applications, Solid State Phenomena, vols. 156-158, (2010) pp. 69-76 (abstract only).
Written Opinion of International Searching Authority for International Application No. PCT/IB2013/002146 mailed Jan. 1, 2014, 4 pages.
International Preliminary Report on Patentability for International Application No. PCT/IB2013/002146, mailed May 26, 2015, 5 pages.
Chinese Office Action for Chinese APplication No. 201380060390.5 dated Dec. 5, 2016, 10 pages.

* cited by examiner

Fig. 1A

Prior Art

Fig. 1B

Prior Art

PROCESS FOR FABRICATING A SEMICONDUCTOR-ON-INSULATOR SUBSTRATE

CROSS-REFERENCE TO RELATED APPLICATIONS

This application is a national phase entry under 35 U.S.C. §371 of International Patent Application PCT/IB2013/002146, filed Sep. 25, 2013, designating the United States of America and published in English as International Patent Publication WO 2014/080256 A1 on May 30, 2014, which claims the benefit under Article 8 of the Patent Cooperation Treaty and under 35 U.S.C. §119(e) to French Patent Application Serial No. 1203106, filed Nov. 20, 2012, the disclosure of each of which is hereby incorporated herein in its entirety by this reference.

TECHNICAL FIELD

The present disclosure relates to the field of the fabrication of semiconductor-on-insulator structures.

BACKGROUND

Figure 1A:
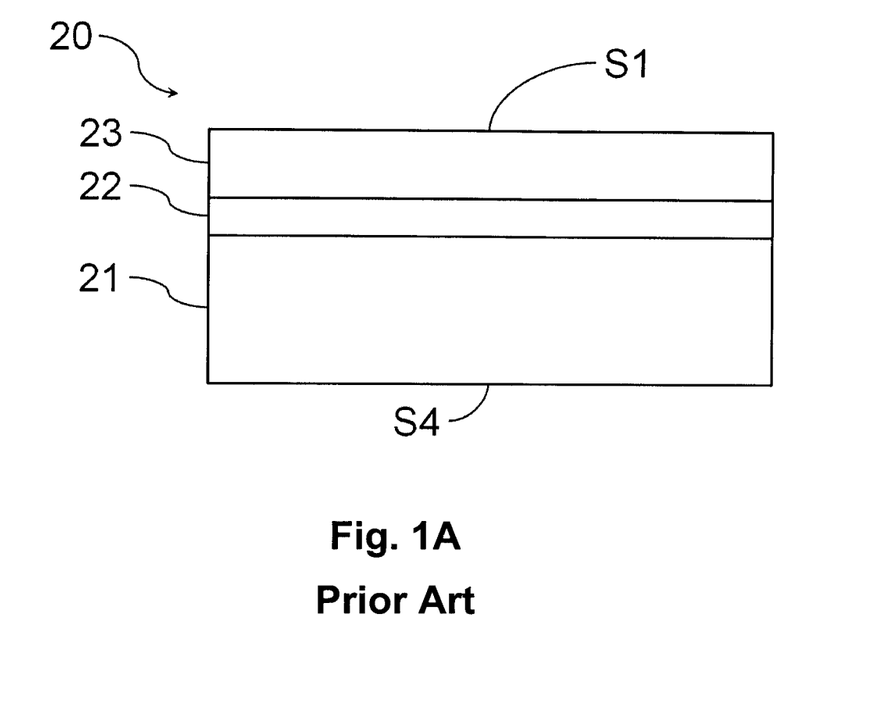
FIGS. 1A and 1B are schematic representations of a structure treated by a process for fabricating a semiconductor-on-insulator structure according to known prior art techniques.
Figure 1B:
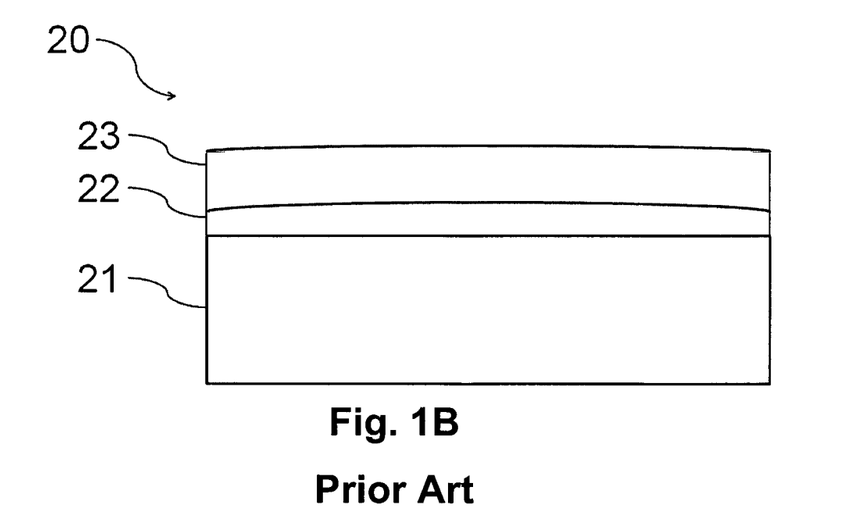

A known prior art fabrication process, illustrated in FIGS. 1A and 1B, is a process for fabricating a plurality of semiconductor-on-insulator structures 20, the insulator being a layer 22 of silicon dioxide of thickness smaller than 50 nm, the fabrication process comprising a step of heat treating the plurality of structures 20, which heat treatment step is designed to partially dissolve the silicon dioxide layer 22.

In this regard, a person skilled in the art will find a technical description of the dissolution of a silicon dioxide layer in the following articles by Kononchuk: Kononchuk et al., "Novel trends in SOI technology for CMOS applications," Solid State Phenomena, Vols. 156-158 (2010) pp. 69-76, and Kononchuk et al., "Internal Dissolution of Buried Oxide in SOI Wafers," Solid State Phenomena, Vols. 131-133 (2008) pp. 113-118.

Each structure 20 comprises a semiconductor layer 23 placed on the silicon dioxide layer 22, the semiconductor layer 23 having a free surface S1.

The silicon dioxide layer 22 rests on a carrier substrate 21.

The carrier substrate 21 has a free side S4.

Figure 2:
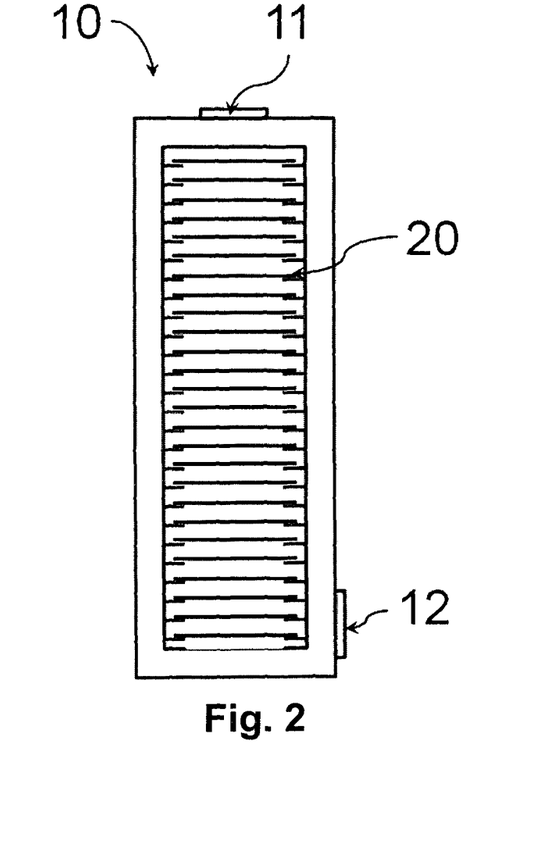
FIG. 2 is a schematic representation of an oven intended for carrying out a heat treatment for dissolving a buried silicon dioxide layer according to known prior art techniques.

The heat treatment is designed to partially dissolve the buried silicon dioxide layer 22. It is generally carried out in an oven 10 containing a plurality of structures 20. As shown in FIG. 2, the structures 20 intended to be heat treated are stacked in the oven 10 so that the free surface S1 of the semiconductor layer 23 of each structure 20 faces the free side S4 of the carrier substrate 21 of the structure 20 above.

A non-oxidizing atmosphere is ensured by a flow of non-oxidizing gas injected into the oven 10 via an inlet 11 and pumped from the oven 10 via an outlet 12.

The main drawback of this heat treatment is that it degrades the thickness uniformity of the silicon dioxide layer 22 and of the semiconductor layer 23, as illustrated in FIG. 1B.

This drawback is not observed in an oven 10 containing a single structure 20. However, given the relatively long heat treatment times and for economic reasons, it is not envisageable from an industrial point of view to carry out such a process in an oven 10 containing only a single structure 20.

As shown in FIG. 1B, after the heat treatment, the thickness of the silicon dioxide layer 22 and the thickness of the semiconductor layer 23 are greater at the center of the structure 20 than at its edge. When the silicon dioxide layer 22 and the semiconductor layer 23 have a thickness greater than 50 nm and 80 nm, respectively, any degradation in the thickness of the layers does not pose a major problem.

However, certain applications require the silicon dioxide layer 22 to have a thickness smaller than 50 nm, in order to allow, for example, an electrical voltage to be applied to devices produced in or on the semiconductor layer 23. It is then necessary for the thickness of the silicon dioxide layer 22 to be very precisely controlled.

Moreover, fully depleted silicon-on-insulator (FDSOI) structures are particularly advantageous for the production of electronic components such as fully depleted metal oxide semiconductor (FDMOS) transistors, the channels of which are formed in or on the semiconductor layer 23.

Because of the extreme smallness of the thickness of the semiconductor layer 23, the threshold voltage of the transistor (usually denoted Vt), which depends on this thickness, is very sensitive to variations in the thickness of the semiconductor layer 23.

One object of the disclosure is, therefore, to provide a process for fabricating semiconductor-on-insulator structures allowing the thicknesses of the semiconductor and silicon dioxide layers 23, 22 to be controlled with precision.

BRIEF SUMMARY

The present disclosure aims to completely or partially remedy the aforementioned drawbacks, and relates to a process for fabricating a plurality of semiconductor-on-insulator structures, the insulator being a layer of silicon dioxide of a thickness smaller than 50 nm, the structures comprising a semiconductor layer placed on the silicon dioxide layer, the process comprising a step of heat treating the plurality of structures, which heat treatment step is designed to partially dissolve the silicon dioxide layer, the process being noteworthy in that the pressure of the non-oxidizing atmosphere is lower than 0.1 bar.

The structures intended to be heat treated are placed in an oven containing a plurality of structures, so that one side of each structure faces a side of another structure.

Thus, during the heat treatment, the silicon dioxide layer partially dissolves, part of the semiconductor layer is consumed, and a semiconductor monoxide is released. In the case of a semiconductor layer made of silicon, silicon monoxide is released during the heat treatment.

Furthermore, the rate at which the silicon dioxide layer dissolves depends on the concentration of semiconductor monoxide in the vicinity of the free surface of the semiconductor layer.

It has been observed that the arrangement of the structures in the oven generates a non-uniform semiconductor-monoxide concentration in the oven. The concentration is higher at the center of the free surface of a semiconductor layer than at its edge. The dissolution reaction is then slower at the center of the structure than at its edge. The non-uniformity in the semiconductor-monoxide concentration in turn leads to non-uniformity in the thickness of the silicon dioxide layer and in the thickness of the semiconductor layer.

Decreasing the pressure of the non-oxidizing atmosphere in the oven to a value lower than 0.1 bar allows the uniformity of the semiconductor-monoxide concentration in the oven to be increased. The non-uniformity in the thickness of the silicon dioxide layer and in the thickness of the semiconductor layer is then decreased.

Moreover, the dissolving heat treatment allows the surface roughness of the semiconductor layer to be decreased.

In one embodiment, the non-oxidizing atmosphere is an inert atmosphere.

The expression "inert atmosphere" is understood to mean an atmosphere that does not react chemically with the semiconductor layer.

Thus, the use of an inert atmosphere allows additional consumption of the semiconductor layer to be prevented.

Moreover, an atmosphere that is not inert with respect to the semiconductor layer could reveal or enlarge defects already present in the semiconductor layer. This is especially the case for a hydrogen-comprising atmosphere and a semiconductor layer comprising at least one material selected from the following group: silicon and germanium.

In another embodiment, the pressure of the atmosphere in the oven is higher than 0.01 bar and preferably higher than 0.05 bar.

In another embodiment, the semiconductor layer has a thickness greater than 230 nm, preferably greater than 250 nm, and even more preferably greater than 280 nm.

The choice of such a thickness for the semiconductor layer allows the rate at which the silicon dioxide layer dissolves to be slowed. This embodiment is particularly advantageous when it is desired to control the thickness of the silicon dioxide layer to within 1 Å.

Furthermore, the decrease in the dissolution reaction rate makes it possible to consider longer heat treatment times and thus decrease the surface roughness of the semiconductor layer.

In another embodiment, the dissolving heat treatment is followed by a step of thinning the semiconductor layer, for example, a sacrificial oxidation step. The sacrificial oxidation comprises forming a thermal oxide layer by thermally oxidizing the semiconductor layer, and then removing the thermal oxide layer in an etching step.

In another embodiment, the semiconductor layer is made of silicon.

This embodiment is advantageous for producing silicon-on-insulator substrates comprising a buried silicon dioxide layer having a thickness smaller than 50 nm.

In another embodiment, the non-oxidizing atmosphere contains argon and/or nitrogen.

In another embodiment, the non-oxidizing atmosphere is controlled so that it contains less than 1 ppm oxygen.

The small amount of oxygen in the atmosphere of the oven allows oxidation and roughening of the surface of the semiconductor layer to be prevented.

In another embodiment, the heat treatment is carried out at a temperature between 900° C. and 1350° C. and preferably between 1150° C. and 1350° C.

In another embodiment, the heat treatment is carried out for a time between 10 minutes and 8 hours and preferably between 10 minutes and 5 hours.

In another embodiment, the silicon dioxide layer has a thickness smaller than 50 nm, preferably smaller than 25 nm, and even more preferably smaller than 15 nm.

BRIEF DESCRIPTION OF THE DRAWINGS

Other features and advantages will become apparent from the following description of embodiments of a fabrication process according to the disclosure, given by way of non-limiting example and with reference to the accompanying drawings in which.

DETAILED DESCRIPTION

In the various embodiments, the same reference numbers have been used for elements that are identical or have the same function in order to simplify the description.

Figure 3A:
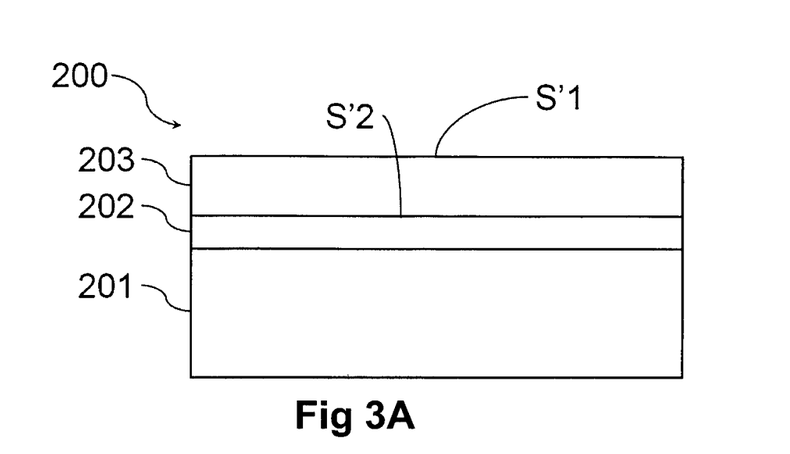
FIGS. 3A and 3B are schematic representations of a structure treated according to the disclosure.
Figure 3B:
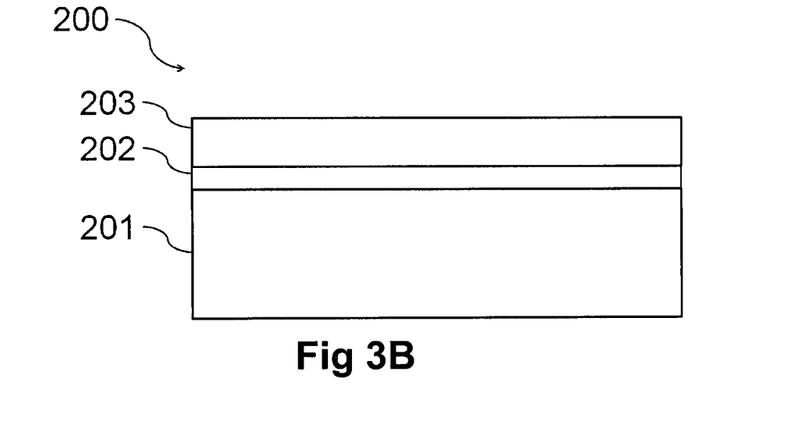

The fabrication process illustrated in FIGS. 3A and 3B is a process for fabricating a plurality of semiconductor-on-insulator structures 200, the insulator being a layer 202 of silicon dioxide of a thickness smaller than 50 nm, each structure 200 comprising a semiconductor layer 203 placed on the silicon dioxide layer 202, the process comprising a step of heat treating the plurality of structures 200, which heat treatment step is designed to partially dissolve the silicon dioxide layer 202, the pressure of the non-oxidizing atmosphere being lower than 0.1 bar.

The silicon dioxide layer 202 generally rests on a carrier substrate 201.

The carrier substrate 201 may be made of any material conventionally used in the microelectronics, optics, optoelectronics and photovoltaic industries. In particular, the carrier substrate 201 comprises at least one material selected from the following group: silicon, silicon carbide, silicon-germanium, glass, a ceramic, and a metal alloy.

The semiconductor layer 203 comprises at least one material selected from the following group: silicon, germanium, and a silicon-germanium alloy.

It is particularly advantageous for the semiconductor layer 203 to be made of silicon.

During the heat treatment of the semiconductor-on-insulator structures 200 various processes come into play:

decomposition of the silicon dioxide at an interface S'2 formed by the silicon dioxide layer 20 and the semiconductor layer 203 into atomic oxygen O and silicon Si;

diffusion of oxygen atoms O through the semiconductor layer 203; and reaction of oxygen atoms O with the atoms of a free surface S'1 of the semiconductor layer 203 to form a volatile semiconductor-monoxide species. In the case where the semiconductor layer 203 is made of silicon, the reaction of oxygen atoms O with the silicon produces silicon monoxide SiO, which is volatile.

The semiconductor monoxide then affects the chemical equilibrium of the dissolution of the silicon dioxide layer 202.

However, it has been observed that the arrangement of the plurality of semiconductor-on-insulator structures 200 in the heat treatment oven limits evacuation of the semiconductor monoxide from the center of the surface of the semiconductor layer 203 relative to its edge.

Figure 4A:
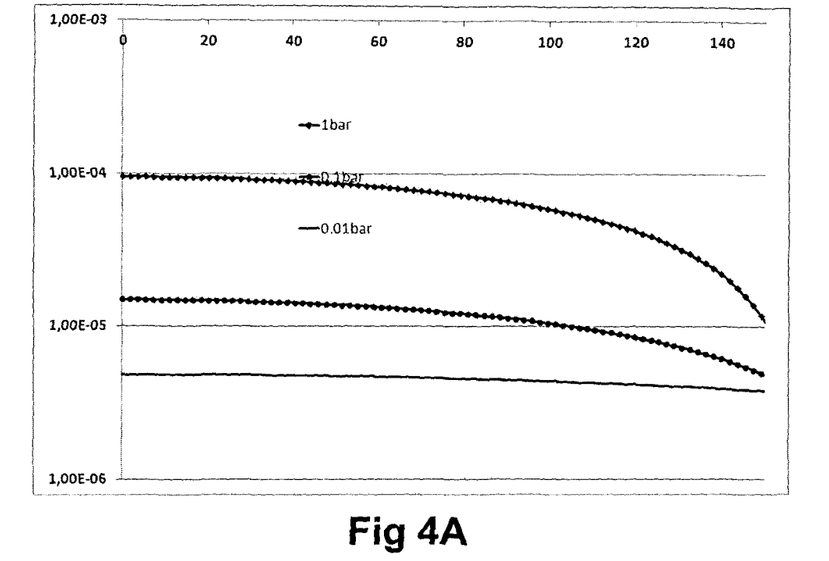
FIG. 4A shows, for non-oxidizing atmosphere pressures of 1, 0.1 and 0.01 bar, plots of the semiconductor-monoxide concentration in the vicinity of the free surface of the semiconductor layer along the radius of the structure.

FIG. 4A shows, for non-oxidizing atmosphere pressures equal to 1, 0.1 and 0.01 bar, the semiconductor-monoxide concentration in the vicinity of the free surface S'1 of the semiconductor layer 203 as a function of distance from the center of the surface S'1. The x-axis 0 corresponds to the center of the surface S'1, the distance is expressed in mm, and the structure 200 in question has a diameter of 300 mm.

Figure 4B:
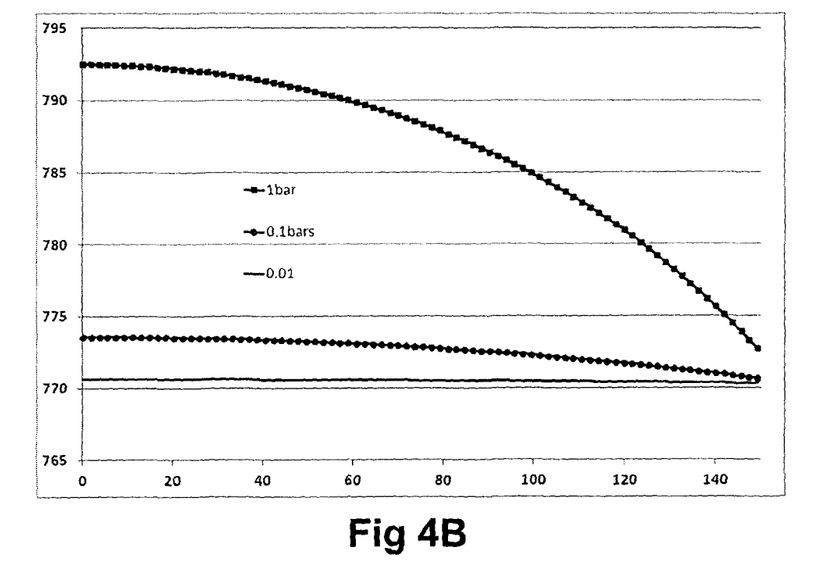
FIG. 4B shows, for non-oxidizing atmosphere pressures of 1, 0.1 and 0.01 bar, the variation in the thickness of the silicon dioxide layer along the radius of the surface of the structure.

FIG. 4B shows, for non-oxidizing atmosphere pressures equal to 1, 0.1 and 0.01 bar, the thickness of the silicon dioxide layer 202 as a function of distance from the center of the free surface S'1. The x-axis 0 corresponds to the center of the surface S'1, the distance is expressed in mm, and the structure 200 in question has a diameter of 300 mm.

When the pressure of the non-oxidizing atmosphere is equal to 1 bar, a clear semiconductor-monoxide concentration difference is observed between the center and the edge of the free surface S'1. As a result, the silicon dioxide layer 202 dissolves more rapidly at the edge of the semiconductor-on-insulator structure 200 than at its center, as shown in FIG. 4B.

Decreasing the pressure of the non-oxidizing atmosphere in the oven, in the step of heat treating the silicon-on-insulator structures 200, to values lower than 0.1 bar allows the semiconductor-monoxide concentration difference at the free surface S'1 of the semiconductor layer 203 to be decreased. It is thus possible to reduce the non-uniformity of the semiconductor layer 203.

It is also advantageous for the pressure of the non-oxidizing atmosphere in the oven to be kept above 0.01 bar and preferably above 0.05 bar.

The heat treatment oven is, for example, a dissolution oven designed to treat a plurality of structures 200. The heat treatment oven is, for example, a QUIXACE® oven as sold by Kokusai.

The heat treatment oven is designed to maintain a non-oxidizing atmosphere.

Advantageously, during the heat treatment step, the non-oxidizing atmosphere in the oven is controlled so that it contains less than 1 ppm oxygen.

It is also advantageous for the non-oxidizing atmosphere in the oven to be an inert atmosphere. An inert atmosphere is an atmosphere that does not react chemically with the semiconductor layer 203. Hydrogen is not considered to be an inert atmosphere with respect to a semiconductor layer 203 comprising a material chosen from the following group: silicon, germanium, and a silicon-germanium alloy. A heat treatment in a hydrogen atmosphere could reveal or enlarge defects in a semiconductor layer 203 comprising silicon, germanium or a silicon-germanium alloy.

It is particularly advantageous for the non-oxidizing atmosphere to contain an element chosen from the following group: argon and nitrogen.

Advantageously, the heat treatment is carried out at a temperature between 900° C. and 1350° C. and preferably between 1150° C. and 1350° C.

Advantageously, the heat treatment is carried out at a temperature above 1150° C.

The silicon dioxide layer 202 has a thickness smaller than 50 nm, preferably smaller than 25 nm, and even more preferably smaller than 15 nm.

It is particularly advantageous for the semiconductor layer 203 to have a thickness greater than 230 nm, preferably greater than 250 nm, and even more preferably greater than 280 nm.

Using semiconductor layers 203 of such thicknesses allows the rate of dissolution of the silicon dioxide layer 202 during the heat treatment to be decreased and, therefore, the decrease in the thickness of the silicon dioxide layer 202 to be controlled with greater precision.

Moreover, combination with a pressure lower than 0.1 bar allows the chemical equilibrium of the dissolution to be limited essentially by the diffusion of oxygen atoms through the semiconductor layer 203 rather than by the diffusion of the semiconductor monoxide.

Example 1

A heat treatment according to the disclosure is carried out on silicon-on-insulator structures 200 comprising a silicon dioxide layer of 30 nm to 40 nm thickness and a semiconductor layer made of silicon of 100 nm thickness.

The heat treatment is carried out at a temperature of 1200° C. for 5 minutes to 10 minutes in a non-oxidizing atmosphere comprising only argon or nitrogen. The heat treatment allows the thickness of the silicon dioxide layer to be decreased to between 10 and 20 nm.

After the heat treatment, the structures 200 are subjected to a step of thinning the silicon layer, i.e., to an oxidation followed by an oxide removal, in order to obtain a 12-nm thick silicon layer.

If the pressure of the non-oxidizing atmosphere is equal to 1 bar during the heat treatment, this results in a silicon dioxide layer with a thickness non-uniformity of 3 nm and a silicon layer with a thickness non-uniformity of 1.5 nm.

Decreasing the pressure of the non-oxidizing atmosphere to a pressure below 0.1 bar allows the non-uniformity in the silicon dioxide and silicon layers to be decreased to values below 0.5 nm and 0.2 nm, respectively.

Example 2

A heat treatment according to the disclosure is carried out on silicon-on-insulator structures 200 comprising a silicon dioxide layer of 30 nm to 40 nm thickness and a semiconductor layer made of silicon of 300 nm thickness.

The heat treatment is carried out at a temperature of 1200° C. for about ten hours in a non-oxidizing atmosphere comprising only argon or nitrogen. The heat treatment allows the thickness of the silicon dioxide layer to be decreased to between 10 nm and 20 nm.

After the heat treatment, the structures 200 are subjected to a step of thinning the silicon layer, i.e., to an oxidation followed by an oxide removal, in order to obtain a 12-nm thick silicon layer.

If the pressure of the non-oxidizing atmosphere is equal to 1 bar during the heat treatment, this results in a silicon dioxide layer with a thickness non-uniformity of 1 nm to 1.5 nm and a silicon layer with a thickness non-uniformity of 0.5 nm to 1 nm.

Decreasing the pressure of the non-oxidizing atmosphere to a pressure below 0.1 bar allows the non-uniformity in the silicon dioxide and silicon layers to be decreased to values below 0.13 nm and 0.07 nm, respectively.

The process according to the disclosure, therefore, allows a semiconductor-on-insulator structure 200 to be obtained, the silicon dioxide layer of which has a thickness controlled to within less than +/−1 Å and a thickness non-uniformity smaller than 2 Å.

In addition, the heat treatment allows the surface roughness of the semiconductor layer to be decreased.

Thus, silicon-on-insulator structures 200 that are of excellent quality and that are particularly suitable for electronic component fabrication applications for which they are intended are obtained.

The invention claimed is:

1. A fabrication process for fabricating a plurality of semiconductor-on-insulator structures, comprising:
providing a plurality of semiconductor-on-insulator structures each including a carrier substrate, a semiconductor layer, and an insulator layer between the carrier substrate and the semiconductor layer, the insulator being a layer of silicon dioxide having a thickness smaller than 50 nm; and
after providing the plurality of semiconductor-on-insulator structures, heat treating the plurality of semiconductor-on-insulator structures and partially dissolving the silicon dioxide layer of each of the semiconductor-on-insulator structures in a non-oxidizing atmosphere so as to reduce the thickness of the silicon dioxide layer of each of the semiconductor-on-insulator structures, wherein a pressure of the non-oxidizing atmosphere is lower than 0.1 bar.

2. The fabrication process according to claim 1, wherein the non-oxidizing atmosphere is an inert atmosphere.

3. The fabrication process according to claim 2, wherein the non-oxidizing atmosphere contains argon and/or nitrogen.

4. The fabrication process according to claim 3, wherein the non-oxidizing atmosphere is controlled so that it contains less than 1 ppm oxygen.

5. The fabrication process according to claim 4, wherein the pressure of the non-oxidizing atmosphere is higher than 0.01 bar.

6. The fabrication process according to claim 5, wherein the semiconductor layer of each of the semiconductor-on-insulator structures has a thickness greater than 230 nm prior to heat treating the plurality of semiconductor-on-insulator structures.

7. The fabrication process according to claim 6, wherein the semiconductor layer of each of the semiconductor-on-insulator structures is made of silicon.

8. The fabrication process according to claim 7, wherein the heat treating of the plurality of semiconductor-on-insulator structures is carried out at a temperature between 900° C. and 1350° C.

9. The fabrication process according to claim 8, wherein the heat treating of the plurality of semiconductor-on-insulator structures is carried out for a time between 10 minutes and 8 hours.

10. The fabrication process according to claim 9, wherein the thickness of the silicon dioxide layer of each of the semiconductor-on-insulator structures is smaller than 25 nm prior to heat treating the plurality of semiconductor-on-insulator structures.

11. The fabrication process according to claim 10, wherein the thickness of the silicon dioxide layer of each of the semiconductor-on-insulator structures is smaller than 15 nm prior to heat treating the plurality of semiconductor-on-insulator structures.

12. The fabrication process according to claim 1, wherein the non-oxidizing atmosphere is controlled so that it contains less than 1 ppm oxygen.

13. The fabrication process according to claim 1, wherein the pressure of the non-oxidizing atmosphere is higher than 0.01 bar.

14. The fabrication process according to claim 1, wherein the semiconductor layer of each of the semiconductor-on-insulator structures has a thickness greater than 230 nm prior to heat treating the plurality of semiconductor-on-insulator structures.

15. The fabrication process according to claim 14, wherein the semiconductor layer of each of the semiconductor-on-insulator structures has a thickness greater than 250 nm prior to heat treating the plurality of semiconductor-on-insulator structures.

16. The fabrication process according to claim 15, wherein the semiconductor layer of each of the semiconductor-on-insulator structures has a thickness greater than 280 nm prior to heat treating the plurality of semiconductor-on-insulator structures.

17. The fabrication process according to claim 1, wherein the semiconductor layer of each of the semiconductor-on-insulator structures is made of silicon.

18. The fabrication process according to claim 1, wherein the heat treating of the plurality of semiconductor-on-insulator structures is carried out at a temperature between 900° C. and 1350° C.

19. The fabrication process according to claim 1, wherein the heat treating of the plurality of semiconductor-on-insulator structures is carried out for a time between 10 minutes and 8 hours.

20. The fabrication process according to claim 1, further comprising controlling the thickness of the silicon dioxide layer of each of the semiconductor-on-insulator structures to within less than +/−1 Å and a non-uniformity smaller than 2 Å.

* * * * *

UNITED STATES PATENT AND TRADEMARK OFFICE
CERTIFICATE OF CORRECTION

PATENT NO. : 9,679,799 B2
APPLICATION NO. : 14/441473
DATED : June 13, 2017
INVENTOR(S) : Christophe Gourdel and Oleg Kononchuk It is certified that error appears in the above-identified patent and that said Letters Patent is hereby corrected as shown below:

In the Specification
Column 4, Line 51, change "dioxide layer 20" to --dioxide layer 202--

Signed and Sealed this
Twenty-third Day of January, 2018

Joseph Matal
*Performing the Functions and Duties of the*
*Under Secretary of Commerce for Intellectual Property and*
*Director of the United States Patent and Trademark Office*